(12) United States Patent
Taylor et al.

(10) Patent No.: US 7,260,168 B2
(45) Date of Patent: Aug. 21, 2007

(54) NETWORK MEASUREMENT METHOD AND APPARATUS

(75) Inventors: David Finlay Taylor, Edinburgh (GB); David Alexander Bisset, Dingwall (GB)

(73) Assignee: Agilent Technologies, Inc., Palo Alto, CA (US)

( * ) Notice: Subject to any disclaimer, the term of this patent is extended or adjusted under 35 U.S.C. 154(b) by 568 days.

(21) Appl. No.: 10/084,498

(22) Filed: Feb. 28, 2002

(65) Prior Publication Data

US 2002/0136330 A1 Sep. 26, 2002

(30) Foreign Application Priority Data

Mar. 20, 2001 (EP) ................................. 01302553

(51) Int. Cl.
*H03D 3/24* (2006.01)
(52) U.S. Cl. ................. 375/375; 375/226; 375/327; 327/141; 327/147; 327/156; 327/233; 455/67.16; 455/139; 455/180.3; 455/260
(58) Field of Classification Search ............... 375/316, 375/326, 327, 354, 355, 226, 371, 373, 375, 375/376; 327/141, 147, 156, 233; 455/67.16, 455/139, 180.3, 260
See application file for complete search history.

(56) References Cited

U.S. PATENT DOCUMENTS

| | | | | |
|---|---|---|---|---|
| 5,187,719 A | | 2/1993 | Birgenheier et al. | |
| 5,425,060 A | * | 6/1995 | Roberts et al. | 375/371 |
| 5,754,437 A | * | 5/1998 | Blazo | 702/75 |
| 5,832,043 A | * | 11/1998 | Eory | 375/344 |
| 5,920,220 A | * | 7/1999 | Takao et al. | 327/233 |
| 6,097,766 A | * | 8/2000 | Okubo et al. | 375/324 |
| 6,104,762 A | * | 8/2000 | Fujimura | 375/324 |
| 6,151,076 A | * | 11/2000 | Hoffman et al. | 348/512 |
| 6,415,004 B1 | * | 7/2002 | Fujimura et al. | 375/324 |
| 6,684,033 B1 | * | 1/2004 | Doh et al. | 398/202 |

FOREIGN PATENT DOCUMENTS

| | | |
|---|---|---|
| EP | 0 849 907 A | 7/1997 |
| EP | 1 054 522 A | 5/2000 |
| EP | 1 152 562 A1 | 7/2001 |

\* cited by examiner

*Primary Examiner*—Mohammed Ghayour
*Assistant Examiner*—Freshteh Aghdam

(57) ABSTRACT

The apparatus measures timing variations, such as the jitter or wander in a timing signal (100) of a telecommunications network. A recovered clock signal is sampled and digitized to produce a series of digital clock samples which are then processed (135) with reference to a local digital reference signal to produce digital baseband frequency in-phase (I) and quadrature (Q) components (165, 170) these being further processed (145) to produce the digital phase information of said clock signal to determine (175) the required parameters of the network. The step of digitally processing said clock samples with reference to a local reference signal can be conveniently and cheaply implemented using a digital signal down-converter IC (135), for example of a type existing for digital radio receiver implementations. For jitter measurement, the local reference signal may be generated by a phase-locked loop (as in FIG. 2). For wander measurements an external reference clock is used (as in FIG. 3).

18 Claims, 3 Drawing Sheets

NETWORK MEASUREMENT METHOD AND APPARATUS

The present invention relates to a method of and apparatus for measuring parameters of an electronic system. The invention may be applied in the measurement of timing variations in digital transmission systems. Parameters such as jitter and wander, as defined by the International Telecommunications Union (ITU-T), can be measured as well as other associated parameters.

Modern telecommunications networks demand a high degree of synchronisation between network transmission elements. Synchronisation for the network transmission elements in Synchronous Digital Hierarchy (SDH) architectures is critical. However, phase variations in the reference clock frequencies governing synchronous network elements may introduce errors at various stages in the network. Timing errors are of concern in such networks as they impact greatly on performance and the quality of service provided. It is therefore of the utmost importance that test equipment can accurately and quickly model timing errors in such networks.

Two important measurements of timing error in SDH networks are jitter and wander. Particular definitions of what constitute jitter and wander can be found in ITU-T recommendation G.810, although other definitions are of course possible. Jitter and wander are the short- and long-term variations respectively of the significant instances of a digital signal from their ideal positions in time. According to ITU G.810, "short-term" implies any such variations are of a frequency greater or equal to 10 Hz and "long-term" implies variations of a frequency less than 10 Hz.

Various other measures of timing errors in synchronous digital transmission systems can be derived from jitter and wander measurements, giving additional data on the network systems under scrutiny. Jitter and wander data, together with these other parameters, can be used to evaluate the performance of equipment and systems, often to diagnose a fault which has developed and which impairs customer service.

Previously known solutions to measuring jitter and wander have been largely analogue in approach and implementation. This has several disadvantages, including hardware limitations. Using heavily analogue-based equipment introduces non-linearities into measurements. Different measurements across different protocol standards demand different hardware specifications.

Prior solutions have involved external hardware processing of the recovered clock signal. Traditionally the external signals would be measured using a conventional phase detector and tracking loop approach, where the external phase detector is scaled to the maximum jitter to be measured and the tracking bandwidth setting the low frequency cut-off. The jitter to be measured is first demodulated in discrete hardware and then sampled to be processed. This is all hardware intensive and is prone to setting an drift problems associated with low frequency analogue processing. Inaccuracies may arise due to hardware tolerances and signal aliasing due to low sampling frequency. For the case of jitter where the hardware processing is more intensive, problems associated with low frequency analogue processing can arise due to settling and drift.

Examples to solutions to such problems include EP 0 849 907 which discloses a phase measurement method and apparatus which digitises phase difference signals within an analogue phase locked loop (PLL). Co-pending European patent applications 1 054 522 and 1 152 562 disclose methods of measuring jitter and wander parameters such as MTIE and TDEV using filter cascades to accelerate processing of jitter and wander data. These approaches, while compatible with the present invention, still perform phase detection in the analogue domain so that the problems associated with an analogue/mixed signal approach still persist.

It is an object of the present invention to provide a method and apparatus to measure timing variations in an input signal accurately over a wide frequency range of variations.

It is a further object of the present invention to provide an improved method and apparatus to provide one or both of jitter and wander measurements.

The invention in a first aspect provides a method of measuring parameters of an electronic system by reference to a series of data samples comprising the steps of:
 (a) recovering a clock signal from an input signal received from the electronic system;
 (b) sampling and digitising said recovered clock signal to produce a series of digital clock samples;
 (c) processing said digital clock samples digitally with reference to a local digital reference signal to produce digital baseband frequency in-phase (I) and quadrature (Q) components;
 (d) processing said digital I and Q components to extract digital phase information of said clock signal; and
 (e) processing said digital phase information to determine a parameter of an electronic system.

The step (c) may conveniently and cheaply be implemented using a digital signal down-converter IC of a type known for digital radio receiver implementations.

The steps (d) and (e) may be implemented in a single programmable digital signal processor chip, although of course other hard-wired or programmed logic arrangements could be used instead. Use of a programmable component such as a digital signal processor allows for programmable filter bandwidths over a wide range of frequencies, for example.

The network may further comprise (a1) frequency-dividing said recovered clock signal prior to said sampling step.

The frequency dividing step may be performed so as to reduce the frequency of the recovered clock signal for sampling while measuring recovered clock signals of different frequencies. The reduced frequency may be fixed, or variable.

The processing of said digital clock samples to produce baseband frequency in-phase (I) and quadrature (Q) components may comprise splitting said digital clock samples into at least two components and mixing them with a respective reference signals derived from a said local digital reference signal.

The processing of said baseband frequency I and Q components to extract phase information may further comprise the step of filtering and decimating said I and Q components.

The step of extracting phase information may comprise applying an inverse tangent function to said filtered and decimated I and Q components by digital signal processing.

In one embodiment of the invention, the phase of said local digital reference signal is controlled in response to the extracted phase information as part of a phase-locked loop (PLL). The phase-locked loop may include a low-pass filter.

The extracted digital phase information may be processed into clock jitter data at step (e) by digitally filtering the phase information outside the phase-locked loop. The measurement filtering here may comprise of high-pass digital filtering of the phase information. The filtering may further comprise a low-pass digital filter stage additional to that in the phase-locked loop. The resultant demodulated jitter may be further processed to derive other timing related data.

In another embodiment of the invention processing said local digital reference signal is an externally sourced timing signal, independent of the received signal. This is appropriate for the measurement of longer-term variations, such as wander.

The extracted digital phase information may be processed into clock time interval error data by filtering this phase information. The filtering here may comprise of low-pass digital filtering of the phase information. The resultant time interval error data may be further processed to derive other timing related data such as wander data.

The method may be implemented in a form of hardware switchable between phase-locked and independent reference signals according to the measurement desired.

The method may be used as pre-processing for an apparatus providing composite measurements including MTIE, MRTIE and TDEV, as defined by ITU standards. The invention may be further integrated into such an apparatus.

These and other features, together with their advantages will be apparent to the skilled reader from the description of specific embodiments which follows.

BRIEF DESCRIPTION OF THE DRAWINGS

Embodiments of the invention will now be described, by way of example only, with reference to the accompanying drawings, in which.

DETAILED DESCRIPTION OF THE EMBODIMENTS

Figure 1:
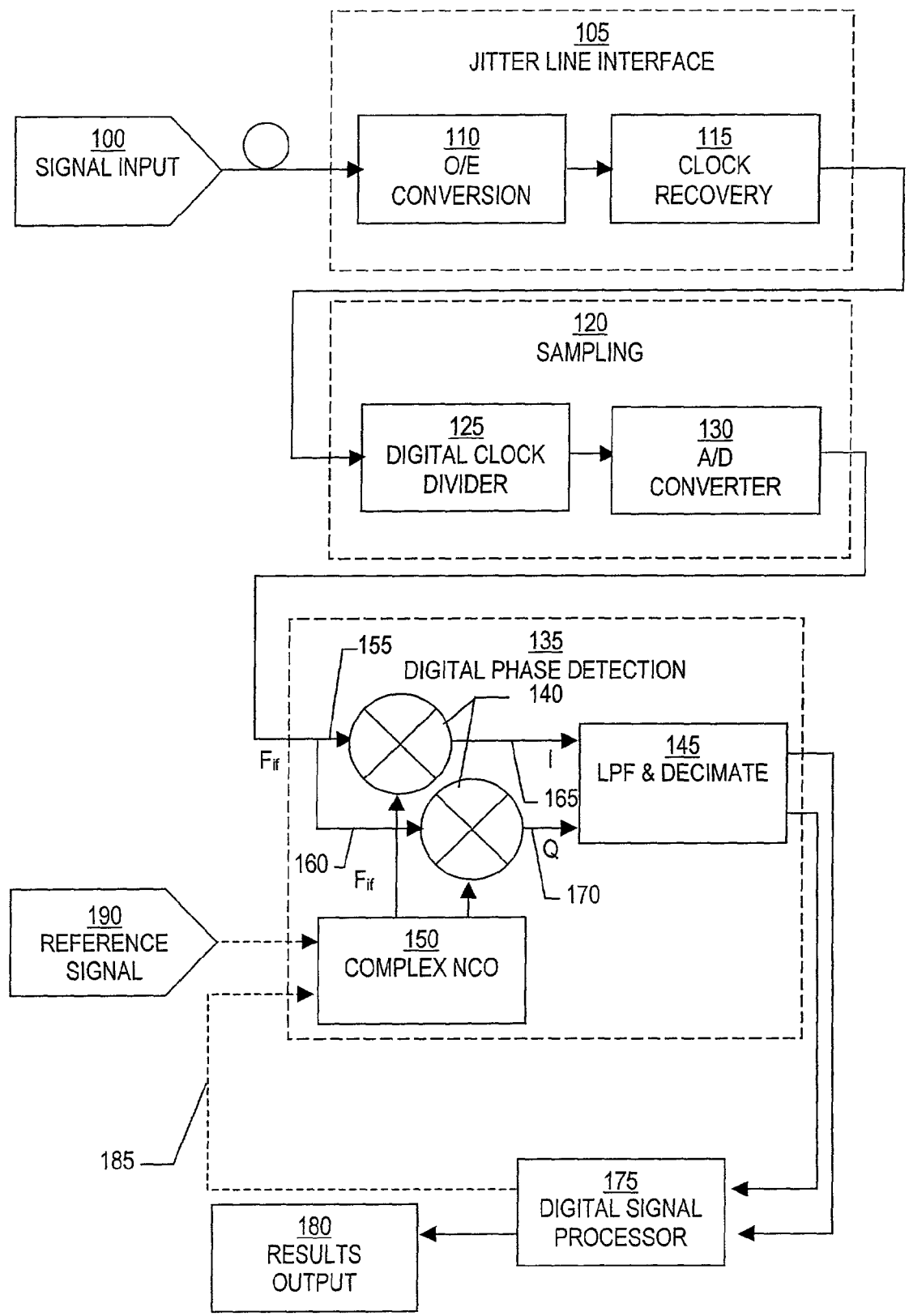
FIG. 1 is a block diagram of an apparatus for measurement of jitter and wander according to the present invention.

FIG. 1 is a block diagram of a test apparatus for the measurement of jitter and/or wander in communications networks. In practice, the same apparatus will be capable of deriving various measurements from the system. For example, the International Telecommunications Union (ITU-T) specifies other measurements such as MRTIE and TDEV which provide information on timing performance. By providing the basic data required using the present apparatus these other measurements can be quickly and efficiently calculated.

In the configuration shown, a synchronous digital hierarchy (SDH) signal 100 is fed by optical fibre into a jitter line interface 105. This comprises a conversion component 110 which converts the input optical data signal into an electrical signal and a clock recovery component 115 which outputs a recovered line clock. The recovered line clock is then input into a sampling block 120. Block 120 consists of a digital clock divider 125 and analogue to digital converter 130. Divider 125 is adaptable to different network clock frequencies, so as to output a lower frequency clock signal, as mentioned further below.

A digital phase detection (DPD) block 135 comprises mixing junctions 140, filter component 145 and a complex numerically controlled oscillator (NCO) 150. The recovered clock signal digitised by ADC 130 is split into two signals 155, 160 and input into mixers 140. A complex reference signal from the NCO 150 is also input into the mixers 140. The complex output of the mixers junctions is then input into filter component 145. Frequency translation is carried out by the mixers 140 with NCO 150 which translate the input digitised clock signal to baseband frequency. It will be understood that the term "complex" here refers to signals and circuits having in-phase (I) and quadrature (Q) components, equally known as "real" and "imaginary" components.

After processing by DPD 135 the resultant signal is then input into a digital signal processor (DSP) 175. The DSP 175 processes the phase signal data to produce a results output at 180. The actual results output and associated processing is dependent on the particular measurement configuration specified through programming of the DPD and DSP, as will be illustrated below.

Dependent on the measurement configuration specified, NCO 150 can be controlled either by a signal 185 originated from the DSP 175 or an externally sourced reference signal 190. The apparatus can be configured for jitter type measurements where a locally derived signal 185 is input from DSP 175 into the DPD 135 forming a phase-locked loop. The apparatus can be configured for wander type measurements where the reference signal is input from an external reference signal source 190 suitable for use as a wander reference clock source. Before describing these specific configuration options, the general operation of the apparatus will now be described.

The apparatus of FIG. 1 is capable of receiving a communications network signal as an input. Typical examples of such signals would be signals according to SDH protocols such as STM-16 or STM-64 as defined the ITU-T. Of course, the apparatus described is in no way limited only to these standards and may be applied to other frequency ranges.

In operation the input optical signal is converted to an electrical signal and the clock recovered by the jitter line interface 105, the recovered clock signal contains timing information relating to jitter and other clock timing information. Digital clock divider 125 divides the clock to a lower frequency to be digitised. This could be typically a 10 MHz–20 MHz clock sampled at a rate of 65 MHz. The use of direct sampling at this stage allows for many advantages. Digital processing is more accurate and more flexible than comparable analogue methods, as well as being less expensive and easier to manufacture.

This step of digitising the recovered clock, and with it the associated timing information, allows for measurements to be carried out completely in the digital domain. This avoids any external hardware processing of the recovered clock where traditionally the signal would be measured using a phase detector and filter.

The actual step of complex phase detection is carried out in the DPD 135 which allows for single integrated circuit implementation. The DPD 135 provides the complex phase detection by mixing the digitised divided-clock with a complex tracking signal from the onboard NCO 150. The complex NCO can be tuned by either an external reference signal 190 or locally derived signal 185. The I and Q base band output 165, 170 is low-pass filtered and decimated in filter means 145 to give raw phase complex outputs for input into DSP 175. Carrying out the phase detection in the digital domain means that detection can be carried out at sufficiently high frequencies to ensure a sampling frequency that is well above the Nyquist rate of the measured signal. The use of digital mixing at this stage provides for true linear performance. The use of low pass and decimating filters provides sufficient rejection of alias image signals, which are caused by the decimation, and also rejection of unwanted mixing products.

Figure 2:
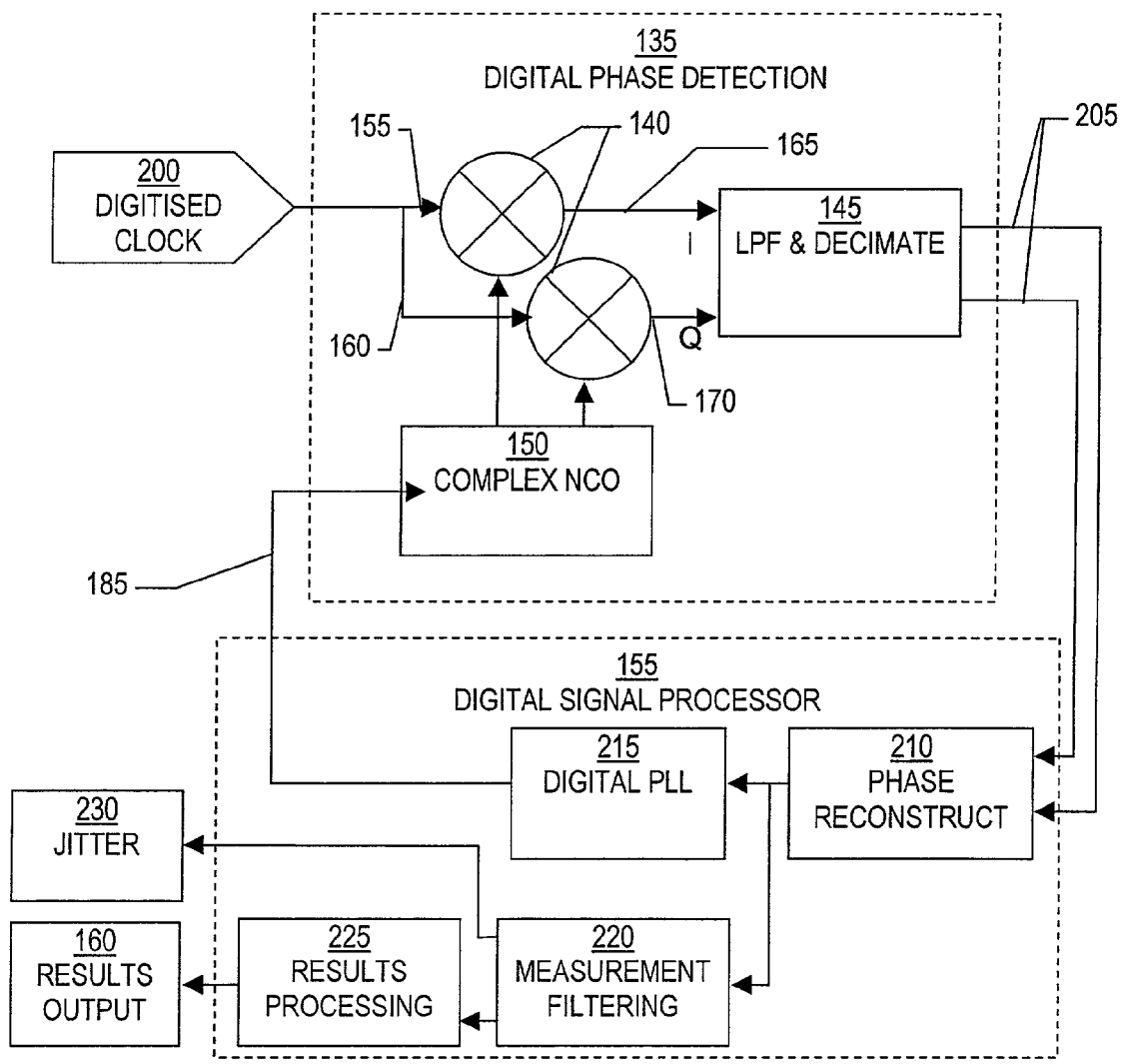
FIG. 2 is a functional block diagram of the apparatus of FIG. 1 when measuring jitter.

The DSP 155 processes the raw phase information obtained from DPD 135. The component set-up of the DSP 155 and processing steps performed on the phase information is dependent on the type of measurement required. FIG. 2 details the configuration for use in jitter measurement and FIG. 3 for wander measurement. In practice, a single DSP configurable for at least both of theses types of measurements is possible.

FIG. 2 shows the configuration of the apparatus of FIG. 1 for use in jitter measurements showing greater detail of the scheme for phase detection and measurement. As described above, the signal under inspection is input and the recovered clock signal converted into an electrical signal and digitised.

The recovered and digitised clock signal 200 is input into the DPD 135 where each functional block operates as described above. The output raw complex phase signal 205 is input into DSP 155. The DSP in this case comprises a phase reconstruction element 210, digital phase locked loop (PLL) 215, measurement filtering stage 220 and results processor element 225.

The DPD 135 provides the complex phase detection by mixing the digitised IF clock with a complex tracking signal from the NCO 150. The NCO on the DPD 135 is tuned in this case by the DSP 155 by means of digital PLL 215. This forms the tracking loop required for the jitter measurement. The I and Q base-band output 165, 170 is low-pass filtered and decimated in the DPD 135 at element 145 to give the raw phase complex outputs 205 for input into the DSP 155.

The filtered and decimated I and Q complex samples 205 are reconstructed into a phase signal in phase reconstruct element 210. The output reconstructed phase signal is fed into to both digital PLL 215 for controlling the NCO 150 and measurement filtering stage 220. The measurement filtering stage converts the digital phase signal to a jitter output using a standard inverse tan digital signal processing routine or look-up table.

The resultant jitter signal is then filtered as a demodulated signal 205 or fed into results processor 225. The results processor can apply further steps of filtering and computation of the jitter signal to produce derived measurements such as RMS or Pk—Pk.

Figure 3:
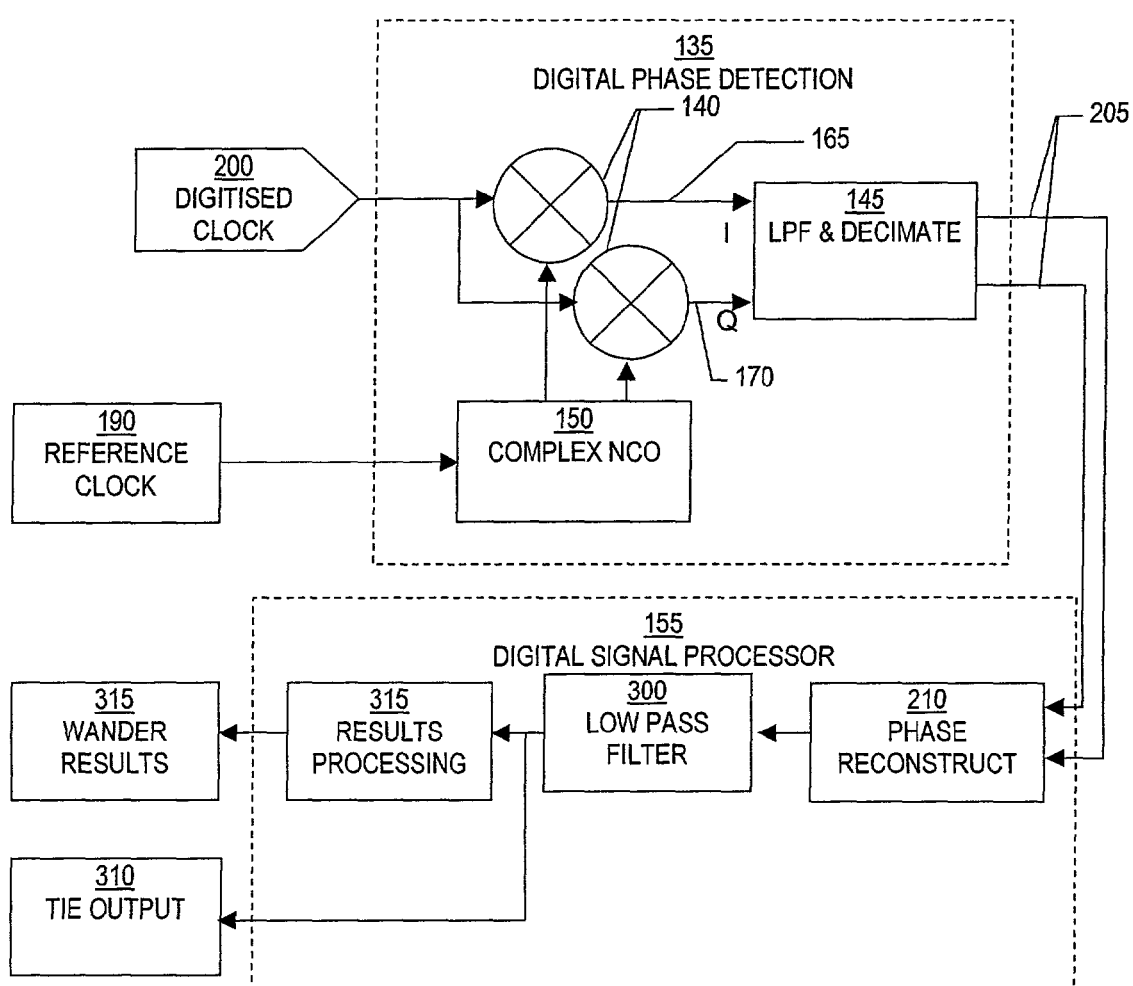
FIG. 3 is a functional block diagram of the apparatus of FIG. 1 when measuring wander.

FIG. 3 illustrates an embodiment suitable for the measurement of wander. As before the recovered and digitised clock signal 200 is input into the DPD 135. The output raw phase signal 205 is input into DSP 155. In this case the DSP 155 comprises phase reconstruct element 210 as before, low-pass filter 300 and results processor 315.

The DPD 135 provides the complex phase detection by mixing the digitised IF clock with a complex signal set to the same signal derived from reference signal 170. Reference signal 170 is used to clock the IF sampler and the DPD 135. The I and Q base-band output 165, 170 is low-pass filtered and decimated in the DPD 135 at element 145 to give the raw phase complex outputs 205 for transfer to the DSP 155.

The filtered and decimated I and Q complex samples 205 are reconstructed into a phase signal in phase reconstruct element 210. The measurement filtering stage converts the digital phase signal samples into a Time Interval Error (TIE) using a standard inverse tan digital signal processing routine or look-up table. The high speed TIE samples are then low-pass filtered as required. ITU-T G.823 requires a $1^{st}$ order low-pass filter of either 10 Hz or 100 Hz.

The resultant TIE samples can be output as raw TIE output data 310 or further processed in results processor 315 to produce TIE derived measurements such as MTIE, MRTIE or TDEV.

The reference signal 190 used for wander measurements may derive from a suitable external reference clock of suitable accuracy for wander measurements, as defined by the ITU-T.

The DPD block 135 in both the jitter and wander measurement configurations can be realised in hardware in a number of ways. For example, it could be implemented using a semi-custom ASIC. Alternatively, implementation can be by way of a versatile single integrated chip such as the Analog Devices AD6620 or Intersil HSP501214B. Such highly integrated devices incorporate all the necessary elements needed such as the NCO 150, filter and decimation 145 stages. These devices are commercially available and are typically used, for example, as digital signal down-converters in digital radio applications.

The use of such an integrated solution brings advantages in the form of easily programmable parameters thus enhancing the versatility of the apparatus. The use of a DSP to perform the processing of the digital phase data also allows for versatility, allowing for a range of different filtering bandwidths to be possible. Such versatility is an important factor as target platform on which testing is to be performed might differ from occasion to occasion. Also, the standards which define such parameters may also change. Such versatility and adaptability would not be fully realisable in solutions taking a more hardwired approach, especially in systems heavily biased towards an analogue approach.

The apparatus and method of obtaining the jitter and wander measurements can be extended for incorporation into other methods and apparatus, providing the raw input data for measurement of parameters such as MTIE, MRTIE and TDEV, among others. For example, the method and apparatus described herein could be used to provide the TIE or other data samples for the apparatus of co-pending European patent applications 1 054 522 and 1 152 562.

The invention claimed is:

1. A method of measuring parameters of an electronic system by reference to a series of data samples comprising the steps of:
    (a) recovering a clock signal from an input signal received from the electronic system;
    (b) sampling and digitising said recovered clock signal to produce a series of digital clock samples;
    (c) processing said digital clock samples digitally with reference to a local digital reference signal to produce digital baseband frequency in-phase (I) and quadrature (Q) components;
    (d) processing said digital I and Q components to extract digital phase information of said clock signal;
    (e) processing said digital phase information to determine a parameter of the electronic system; and
    controlling the phase of said local digital reference signal in response to the extracted phase information as part of a phase-locked loop (PLL).

2. A method as claimed in claim 1, wherein step (c) is implemented using a digital signal down-converter IC of a type suitable for digital radio receiver implementations.

3. A method as claimed in claim 1, wherein the steps (d) and (e) are implemented in a single programmable digital signal processor chip.

4. A method as claimed in claim 1, wherein the network further comprises the step of frequency-dividing said recovered clock signal prior to said sampling step.

5. A method as claimed in claim 1, wherein the frequency dividing step is performed so as to fix the frequency of the digital clock signal for sampling while measuring recovered clock signals of different frequencies.

6. A method as claimed in claim 1, wherein the processing of said digital clock samples to produce baseband frequency in-phase (I) and quadrature (Q) components comprises splitting said digital clock samples into at least two components and mixing them with respective reference signals derived from a said local digital reference signal.

7. A method as claimed in claim 1, wherein the processing of said baseband frequency I and Q components to extract phase information further comprises the step of filtering and decimating said I and Q components.

8. A method as claimed in claim 1, wherein the step of extracting phase information comprises applying an inverse tangent function to said filtered and decimated I and Q components by digital signal processing.

9. A method as claimed in claim 1, wherein the extracted digital phase information is processed into clock jitter data at step (e) by digitally filtering the phase information outside the phase-locked loop.

10. A method as claimed in claim 1, wherein said filtering comprises high-pass digital filtering of the phase information.

11. A method as claimed in claim 10, wherein the filtering further comprises a low-pass digital filter stage additional to that in the phase-locked loop.

12. A method as claimed in claim 1, wherein said local digital reference signal is an externally sourced timing signal, independent of the received signal.

13. A method as claimed in claim 12, wherein the extracted digital phase information is processed into clock time interval error (TIE) data by filtering this phase information.

14. A method as claimed in claim 13, wherein the filtering comprises low-pass digital filtering of the phase information.

15. A method as claimed in claim 13, wherein the resultant time interval error data is further processed to derive wander data.

16. A method as claimed in claim 1, implemented in a form of hardware switchable between phase-locked and independent reference signals according to the measurement desired.

17. A method as claimed in claim 1, wherein the method is used as pre-processing for a composite measurement comprising at least one of Maximum Time Interval Error (MTIE), Maximum Relative Time Interval Error (MTIE), Time Deviation (TDEV), Root Mean Square (RMS), and Peak-to-Peak (Pk—Pk), as defined by any ITU standard.

18. A method as claimed in claim 17, wherein said pre-processing and the derivation of said composite measurement are performed within a single digital signal processor.

* * * * *